(12) United States Patent
Condie et al.

(10) Patent No.: US 7,446,411 B2
(45) Date of Patent: Nov. 4, 2008

(54) SEMICONDUCTOR STRUCTURE AND METHOD OF ASSEMBLY

(75) Inventors: Brian W. Condie, Mesa, AZ (US); Lakshminarayan Viswanathan, Phoenix, AZ (US); Richard W. Wetz, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 290 days.

(21) Appl. No.: 11/257,784

(22) Filed: Oct. 24, 2005

(65) Prior Publication Data

US 2007/0090515 A1    Apr. 26, 2007

(51) Int. Cl.
*H01L 23/10*    (2006.01)
(52) U.S. Cl. ...................... 257/710; 257/725
(58) Field of Classification Search ........... 257/710, 257/732, 729, 696, 695, 725
See application file for complete search history.

(56) References Cited

U.S. PATENT DOCUMENTS

| | | | | | |
|---|---|---|---|---|---|
| 3,381,080 | A | * | 4/1968 | Stelmak | 174/564 |
| 3,626,259 | A | * | 12/1971 | Garboushian et al. | 257/705 |
| 3,729,820 | A | * | 5/1973 | Ihochi et al. | 438/125 |
| 4,524,238 | A | * | 6/1985 | Butt | 174/539 |
| 4,784,974 | A | * | 11/1988 | Butt | 29/827 |
| 4,796,083 | A | * | 1/1989 | Cherukuri et al. | 257/699 |
| 5,055,911 | A | * | 10/1991 | Ogata | 257/711 |
| 5,122,858 | A | * | 6/1992 | Mahulikar et al. | 257/753 |
| 5,309,014 | A | | 5/1994 | Wilson | |
| 5,736,783 | A | * | 4/1998 | Wein et al. | 257/691 |
| 5,773,879 | A | * | 6/1998 | Fusayasu et al. | 257/678 |
| 6,020,636 | A | | 2/2000 | Adishian | |
| 6,072,211 | A | | 6/2000 | Miller et al. | |
| 6,072,238 | A | | 6/2000 | Viswanathan et al. | |
| 6,261,868 | B1 | | 7/2001 | Miller et al. | |
| 6,462,413 | B1 | | 10/2002 | Polese et al. | |
| 6,511,866 | B1 | | 1/2003 | Bregante et al. | |
| 6,867,367 | B2 | | 3/2005 | Zimmerman | |
| 2003/0038362 | A1 | | 2/2003 | Nomura | |

OTHER PUBLICATIONS

International Search Report and Written Opinion.

* cited by examiner

*Primary Examiner*—S. V Clark
(74) *Attorney, Agent, or Firm*—Bryan Cave LLP

(57) ABSTRACT

A semiconductor structure (100, 900) includes a substrate (110) having a surface (111) and also includes one or more semiconductor chips (120) located over the substrate surface. The semiconductor structure further includes an electrical isolator structure (340) located over the substrate surface, where the electrical isolator structure includes one or more electrical leads (341, 342) and an organic-based element (343) molded to the electrical leads. The semiconductor structure also includes a solder element (350) coupling together the electrical isolator structure and the substrate surface.

27 Claims, 7 Drawing Sheets

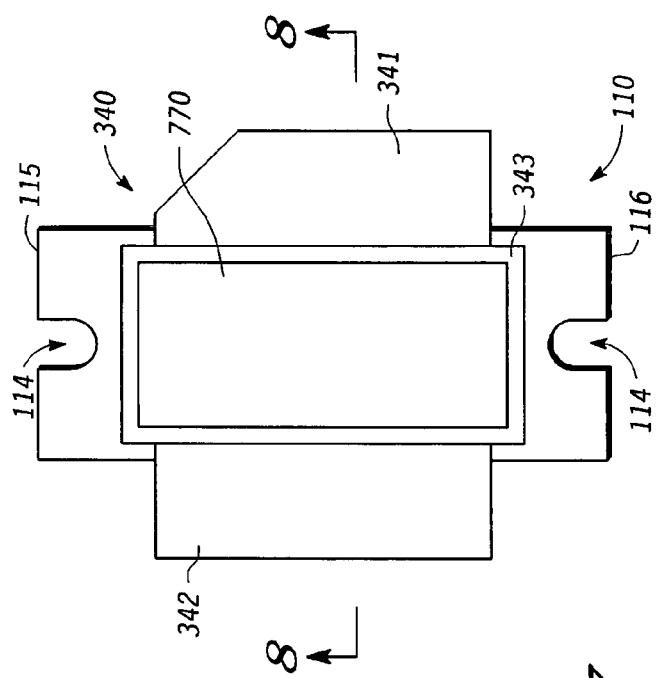
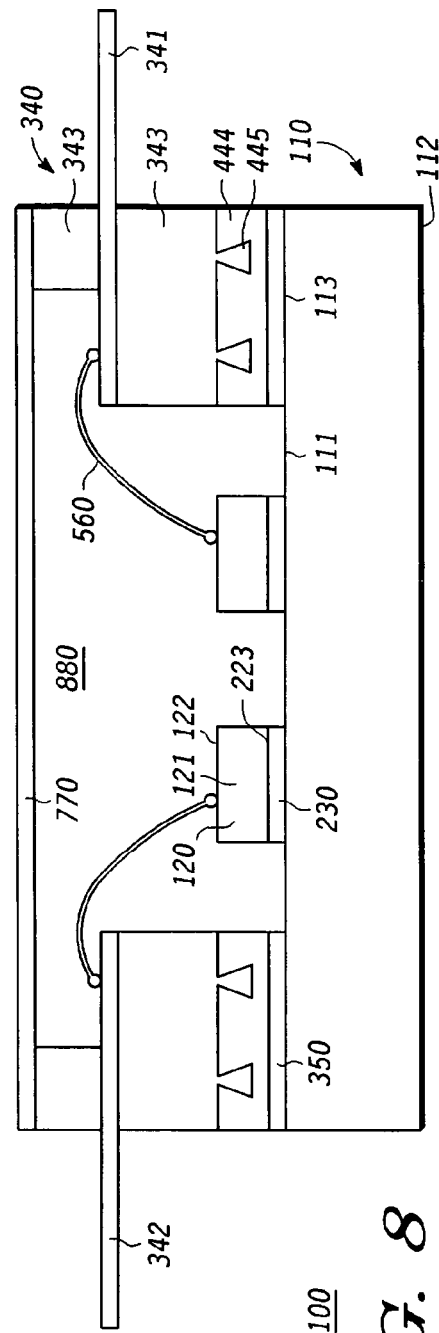
FIG. 7
FIG. 8

SEMICONDUCTOR STRUCTURE AND METHOD OF ASSEMBLY

FIELD OF THE INVENTION

This invention relates generally to semiconductor devices, and relates more particularly to semiconductor device packaging.

BACKGROUND OF THE INVENTION

Semiconductor die or chips are encapsulated in a semiconductor device package to prevent external stresses and the environment from damaging the chips and to provide a system for carrying electrical signals to and from the chips. Many different types of semiconductor packages exist, including dual-in-line packages, pin grid array (PGA) packages, tape-automated bonding (TAB) packages, multi-chip modules (MCMs), and power packages. One type of power package is a radio frequency (RF) power package, which is typically used when a semiconductor device in the semiconductor chip dissipates a power greater than approximately ten watts and operates at a frequency greater than approximately one hundred MegaHertz (MHz). RF power packages often include an internal air gap for lower power loss and better RF performance.

Current high power RF semiconductor packages use ceramic insulators, which are often called "window frames" or "frames" due to their shape, and which are brazed or soldered to a metal source substrate. However, the ceramic insulators are expensive and have poor mechanical tolerances.

Another high power RF semiconductor package is described in U.S. Pat. No. 6,511,866, issued on Jan. 28, 2003 to Bregante et al., and uses a polymer insulator or polymer-based frame. However, this package has potential reliability problems due to an inherently weak polymer/metal interface between the frame and a nickel and/or gold-based surface of the metal source substrate. The poor seal is due to difficulty in creating a mechanically robust and consistent epoxy joint between the frame and the metal source substrate. Additionally, this package also has a high potential for mechanical failure at this polymer/metal interface in view of the new lead-free and other Restriction of Hazardous Substances Directive (RoHS) requirements that are being forced on the industry. Furthermore, this package also has potentially poor mechanical integrity under final mounting conditions.

Yet another high power RF semiconductor package is described in U.S. Pat. No. 6,867,367, issued on Mar. 15, 2005 to Zimmerman. However, this package uses a proprietary, high-temperature polymer material for the frame, which is molded to the metal source substrate before attaching the semiconductor chip to the substrate. Completing the package before the chip attach step creates mechanical reliability problems between the frame and the metal source substrate due to the high temperatures needed to attach or mount the semiconductor chip to the metal source substrate. Completing the package before the chip attach step may also limit the chip attach options. For example, if the polymer melts or degrades at four hundred degrees Celsius, then a gold silicon chip attach process occurring at over four hundred degrees Celsius cannot be used.

Accordingly, a need exists for a new high power RF semiconductor package that is less expensive than ceramic-based packages and that has improved reliability over current polymer-based, air-cavity packages.

BRIEF DESCRIPTION OF THE DRAWINGS

The invention will be better understood from a reading of the following detailed description, taken in conjunction with the accompanying figures in the drawings in which:

FIG. 7 illustrates a top view of the semiconductor structure in FIG. 5 during a later step of the assembly process in accordance with an embodiment of the invention;

FIG. 8 illustrates a cross-sectional view of the semiconductor structure in FIG. 7, as viewed along a section line 8-8 in FIG. 7, in accordance with an embodiment of the invention;

Figure 1:
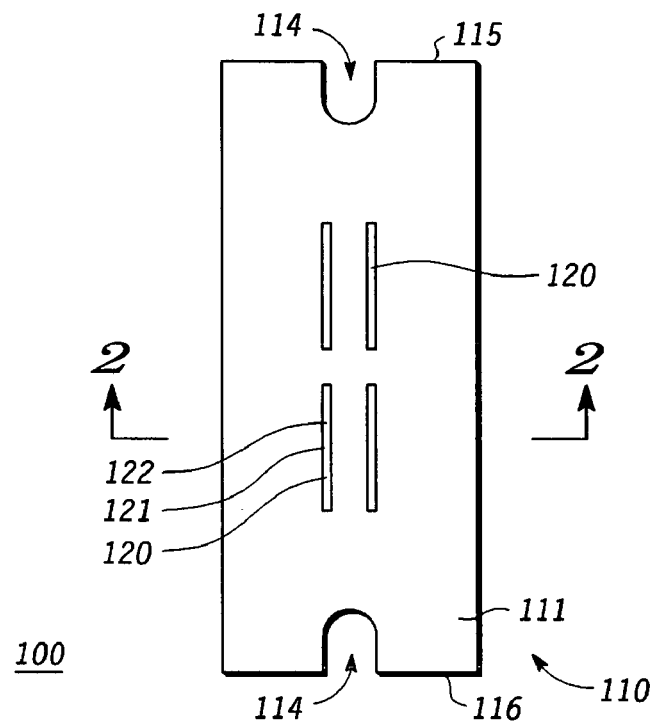
FIG. 1 illustrates a top view of a semiconductor structure in accordance with an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical, mechanical, chemical, or other manner, unless otherwise defined.

DETAILED DESCRIPTION OF EXEMPLARY EMBODIMENTS

Various embodiments of the present invention include a semiconductor structure or semiconductor packaging system for a radio frequency component where a metal element or layer is molded or embedded into a plastic to form a base of an electrical isolator structure to facilitate a solder attachment of the electrical isolator structure to a substrate or flange. Input/output leads are also molded or embedded into the electrical isolator structure, which can reduce piece-part costs, and improve dimensional tolerances, and enable multiple lead structures. In some embodiments, the leads and/or the metal element have mold locking features to enhance the plastic-to-metal adhesion. The metal element provides a more mechanically robust structure by permitting the use of solder, instead of epoxy, to form a joint between the electrical isolator structure and the substrate. The metal element also permits the use of less expensive plastic materials for the plastic portions of the electrical isolator structure.

Other embodiments of the invention can include the metal element having a surface with a surface area facing towards the substrate and can also include the plastic material portion of the electrical isolator structure having a surface with a surface area also facing towards the substrate. In these embodiments, the surface area of the metal element is smaller than the surface area of the plastic material portion. As explained below, this difference in surface area can reduce solder run-out or solder ingress problems because the solder will adhere to the metal element, but not to the exposed plastic material portion of the electrical isolator structure. Some embodiments of the invention include a combination of these features or one or more of these features in combination with other features described herein.

Additionally, some embodiments of the invention can include a process of assembly for the semiconductor structure or semiconductor packaging system where: (1) a semiconductor chip is attached or coupled to the substrate; (2) the electrical isolator structure with the metal element and leads is solder-attached to the substrate; (3) the semiconductor chip is wire bonded to the leads; and (4) a lid is bonded to the plastic material portion of the electrical isolator structure to create a hermetic enclosure or at least a gross leak enclosure. This process of assembly permits the semiconductor chip to be attached to the substrate at a high temperature in the absence of temperature-sensitive plastic materials in the electrical isolator structure, thus allowing the use of many different lower cost plastic materials and also improving reliability.

Figure 2:
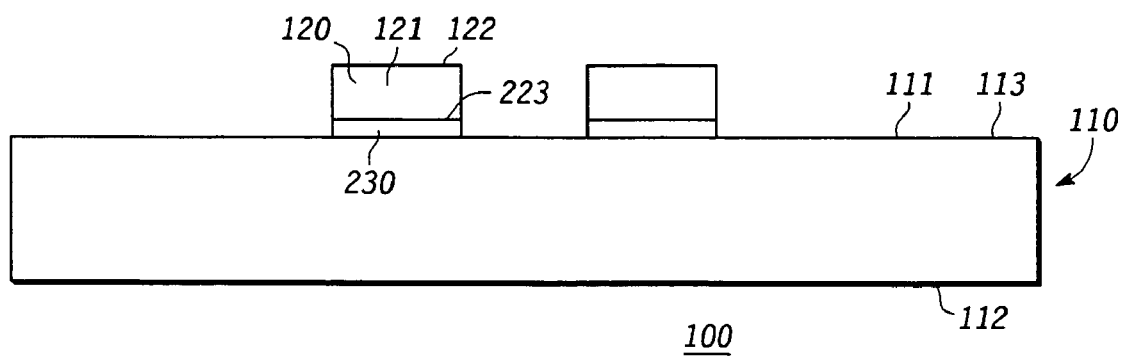
FIG. 2 illustrates a cross-sectional view of the semiconductor structure in FIG. 1, as viewed along a section line 2-2 in FIG. 1, in accordance with an embodiment of the invention.

Referring now to the figures, FIG. 1 illustrates a top view of a semiconductor packaging system or semiconductor structure 100, and FIG. 2 illustrates a cross-sectional view of semiconductor structure 100 as viewed along a section line 2-2 in FIG. 1. Semiconductor structure 100 includes a substrate 110 that has a surface 111 and a surface 112 opposite surface 111. In some embodiments, substrate 110 is referred to as a flange. In the same or different embodiment, substrate 110 serves as a heat sink or heat spreader. In each of these embodiments, substrate 110 can comprise a thermally and/or electrically conductive material such as, for example, copper (Cu), copper-based composites, copper-based laminates, aluminum silicon carbide (AlSiC), copper graphite, diamond, and/or the like. Examples of copper-based composites include copper tungsten (CuW) and copper molybdenum (CuMo), and an example of a copper-based laminate is copper molybdenum copper (CuMoCu).

Surface 111 of substrate 110 can include a layer 113 that overlies the electrically conductive material of substrate 110. Layer 113 can be a metal layer or a solderable metal layer. When layer 113 is a solderable metal layer, layer 113 provides a solderable surface for substrate 110. As an example, layer 113 can be a solderable surface comprised of nickel and gold. In this particular embodiment, layer 113 can comprise a layer of gold and a layer of nickel between the layer of gold and the electrically conductive material of substrate 110. In another embodiment, layer 113 can comprise nickel cobalt (NiCo) and gold (Au). As an example, layer 113 can be plated onto substrate 110 and can also be located on other surfaces of substrate 110, including surface 112.

Substrate 110 can also include optional mounting holes or recesses 114. FIG. 1 depicts two recesses, but the specific quantity of recesses may vary. Recesses 114 can be located at opposite ends 115 and 116 of substrate 110. As explained later, recesses 114 can be used to secure semiconductor structure 100 to another substrate such as, for example, a circuit board.

Semiconductor structure 100 also includes at least one semiconductor chip 120. FIG. 1 depicts four semiconductor chips, but the specific quantity of semiconductor chips may vary. Semiconductor chips 120 are located over surface 111 of substrate 110. In one embodiment, semiconductor chips 120 are comprised of one or more materials suitable for radio frequency or other high frequency devices. In a different or the same embodiment, semiconductor chips 120 are comprised of one or more materials suitable for high power devices. As an example, semiconductor chips 120 can comprise gallium arsenide (GaAs), silicon, (Si), gallium nitride (GaN), or the like. In most embodiments, semiconductor chips 120 can also be referred to as semiconductor die.

Each of semiconductor chips 120 includes at least one semiconductor device 121. Accordingly, semiconductor devices 121 are also located over surface 111 of substrate 110. In an embodiment where semiconductor chips 120 are comprised of silicon, semiconductor devices 121 can be laterally diffused metal oxide semiconductor (LDMOS) devices. At least one of semiconductor devices 121 is an active device (i.e., a transistor) and not merely one or more passive devices (i.e., resistors, capacitors, inductors, etc.), but other ones of semiconductor devices 121 can be matching devices, such as, for example, integrated passive devices (IPDs) and metal-oxide-semiconductor capacitors (MOSCAPs). In a different embodiment, one or more of semiconductor chips 120 is replaced with one or more non-semiconductor components that are matching devices. Examples of these non-semiconductor components include IPDs and low temperature co-fired ceramic (LTCC) matching bricks.

Each of semiconductor chips 120 can have solderable surfaces 122 and 223 comprised of gold (Au), silver (Ag), nickel cobalt gold (NiCoAu), nickel gold (NiAu), or the like. All of surfaces 122 and 223 can be solderable, or only a portion of surfaces 122 and 223 can be solderable. In another embodiment where solder interconnects are not used for semiconductor structure 100, none of surface 122 is solderable.

Semiconductor structure 100 also includes an adhesive 230 located between and coupling together semiconductor chips 120 and surface 111 of substrate 110. In some embodiments, adhesive 230 can be electrically conductive. In these embodiments, adhesive 230 can electrically couple semiconductor chips 120 to substrate 110, which can serve as an electrical lead for semiconductor devices 121 in semiconductor chips 120. Accordingly, in these embodiments, substrate 110 can be referred to as a source substrate or source flange when substrate 110 is an electrical lead for a source electrode of semiconductor devices 121. Also in these embodiments, adhesive 230 includes several discrete or individualized portions.

In one embodiment, adhesive 230 can be any suitable chip or die attach material such as a lead-based or non-lead-based solder. In this embodiment, adhesive 230 can be referred to as a solder element. As an example, suitable non-lead-based solders include gold tin (AuSn), gold silicon (AuSi), or the like. In this embodiment, adhesive 230 solders together a portion of layer 113 at surface 111 and surface 223. When semiconductor chips 120 are comprised of silicon, adhesive 230 can be comprised of a material with a low coefficient of thermal expansion (CTE) such as gold silicon to more closely match the CTE of semiconductor chips 120. In other embodiment, adhesive 230 can be an electrically conductive or non-electrically conductive epoxy or a thermoset or thermoplastic polymer.

Adhesive 230 can be formed on solderable surface 223 of semiconductor chips 120 or on layer 113 of surface 111 of substrate 110 using cladding, plating, screen printing, or solder ball techniques. Adhesive 230 can also be a perform. As explained below, adhesive 230 can also have a melting temperature and a reflow temperature that are higher than melting and reflow temperatures for other adhesives, or solders, that are used during later stages of the manufacturing or assembly process for semiconductor structure 100.

Figure 3:
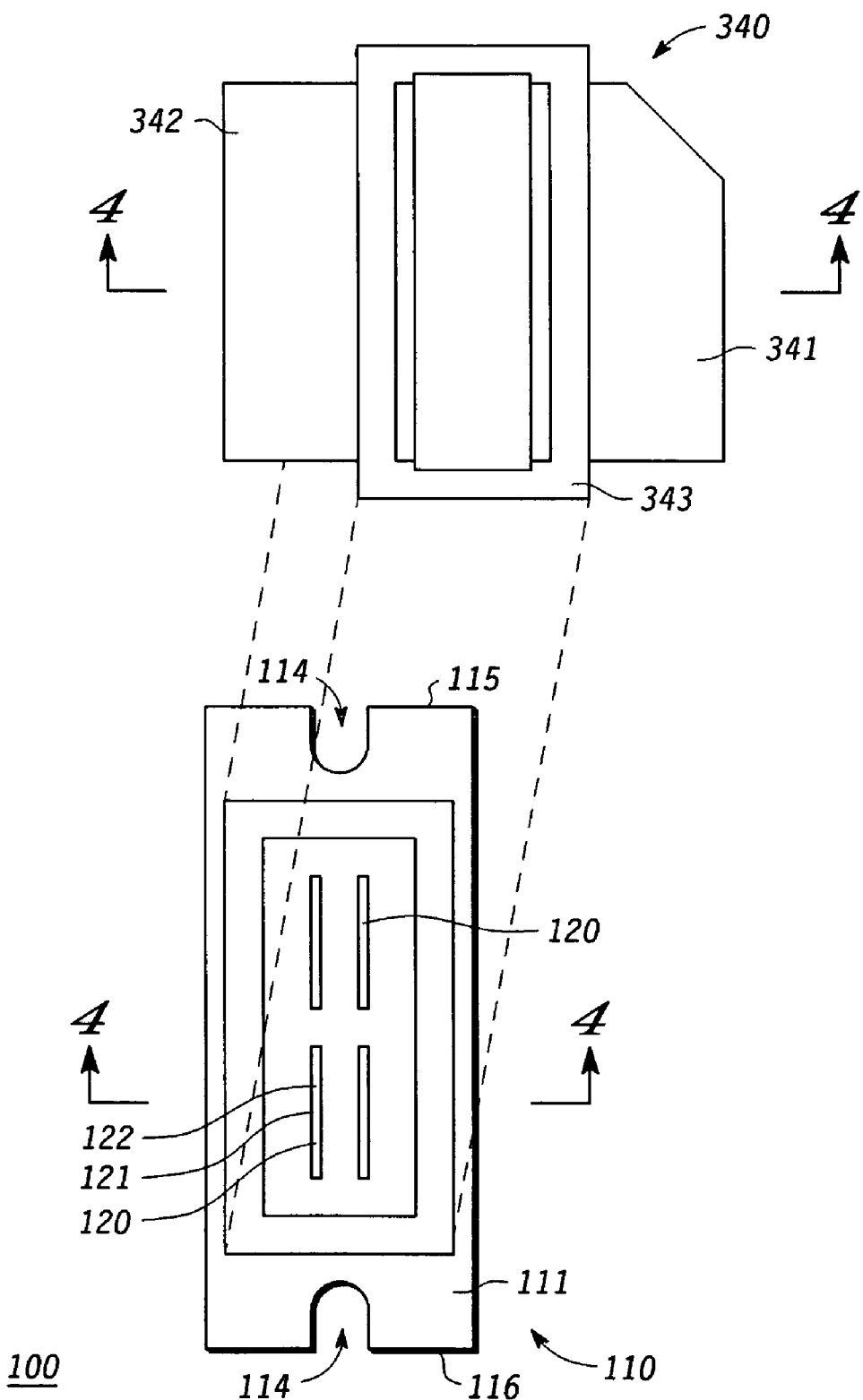
FIG. 3 illustrates an exploded top view of the semiconductor structure in FIG. 1 during a later step of the assembly process in accordance with an embodiment of the invention.
Figure 4:
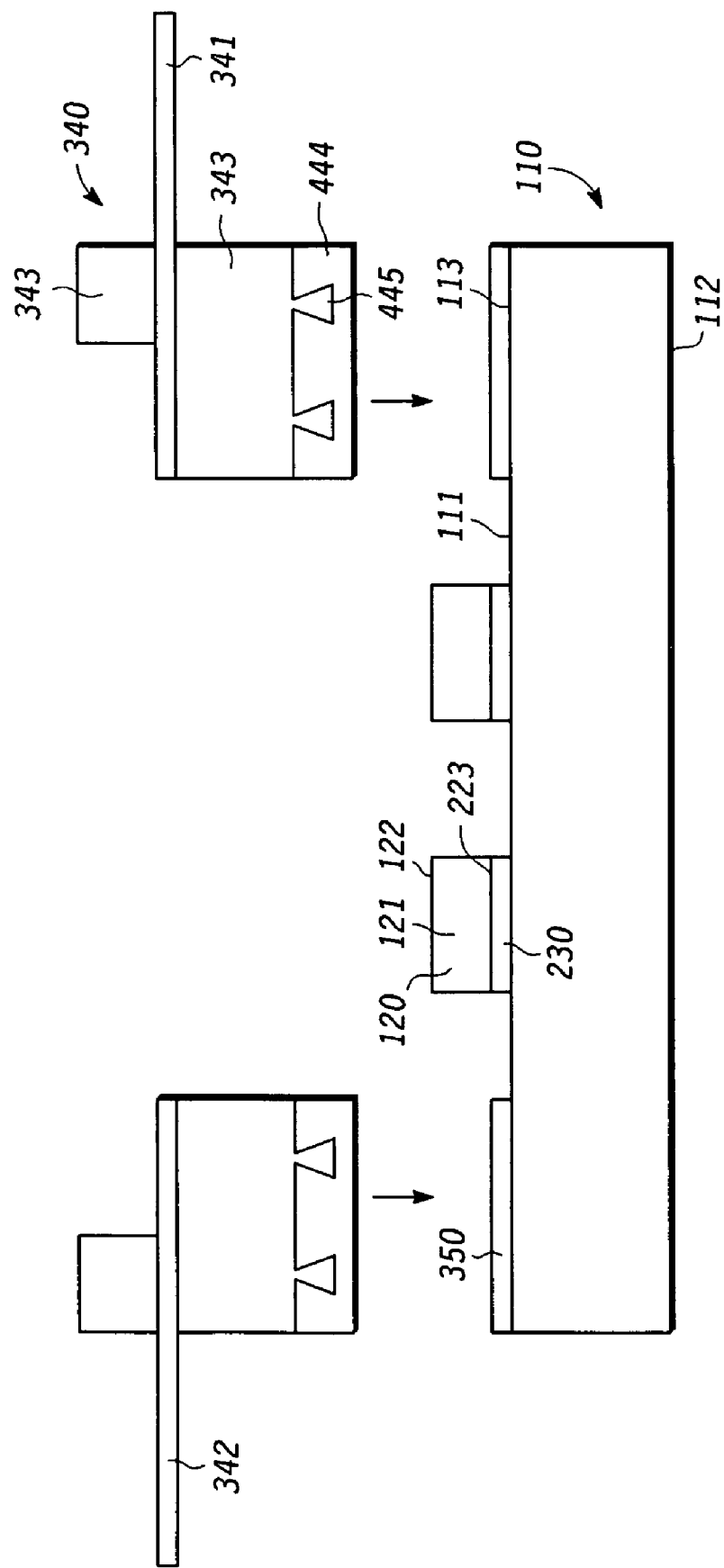
FIG. 4 illustrates a cross-sectional view of the semiconductor structure in FIG. 3, as viewed along a section line 4-4 in FIG. 3, in accordance with an embodiment of the invention.

FIG. 3 illustrates an exploded top view of semiconductor structure 100 during a later step of the assembly process, and FIG. 4 illustrates a cross-sectional view of semiconductor structure 100 as viewed along a section line 4-4 in FIG. 3. Semiconductor structure 100 additionally includes an electrical isolator structure 340 located over surface 111 of substrate 110. As illustrated in FIGS. 3 and 4, electrical isolator structure 340 includes two electrical leads 341 and 342. In general, however, electrical isolator structure 340 can include more or less than two electrical leads. Electrical leads 341 and 342 are used to conduct electrical signals to and from semiconductor devices 121 in semiconductor chips 120 and into and out of semiconductor structure 100. In one embodiment, electrical leads 341 and 342 can be gate and drain leads, respectively, for gate and drain electrodes of semiconductor devices 121. In this embodiment, substrate 110 can serve as a source lead for source electrodes of semiconductor devices 121.

As an example, electrical leads 341 and 342 can comprise electrically conductive materials including, for example, copper, a copper alloy, and other electrically conductive materials identified previously for substrate 110. Additionally, electrical leads 341 and 342 can comprise an iron-based alloy with nickel such as, for example, Alloy 42, whose composition comprises forty-two percent nickel. Electrical leads 341 and 342 can also comprise an iron-based alloy with nickel and cobalt, as sold under the brand name Kovar® by CRS Holdings, Inc., a Delaware corporation.

Electrical leads 341 and 342 can also include a solderable surface to make electrical leads 341 and 342 suitable for wire bonding or other interconnect schemes inside of semiconductor structure 100 and to make electrical leads 341 and 342 suitable for wire bonding or soldering outside of semiconductor structure 100. As an example, the solderable surface of electrical leads 341 and 342 can comprise the same solderable materials identified for layer 113 of substrate 110 (FIGS. 1 and 2) and solderable surfaces 122 and 223 of semiconductor chips 120.

Electrical isolator structure 340 also includes an organic-based element 343 molded to electrical leads 341 and 342. In some embodiments, organic-based element 343 can have the shape of a window frame, as illustrated in FIG. 3. In these embodiments, organic-based element 343 can be referred to as a frame, and electrical isolator structure 340 can be referred to as a frame structure. Organic-based element is comprised of an electrically insulative -material such as, for example, a polymer, a thermoplastic, and/or a thermoset material. Accordingly, in some embodiments, organic-based element 343 can also be referred to as a plastic insulator frame.

Electrical isolator structure 340 further includes a metal element 444, where organic-based element 343 is located between metal element 444 and electrical leads 341 and 342. Metal element 444 can be located at a bottom or base of electrical isolator structure 340. In this embodiment, metal element 444 can also be referred to as a base metal element. Organic-based element 343 electrically isolates or insulates metal element 444 and electrical leads 341 and 342 from each other. Metal element 444 can have the same window frame shape and same footprint as organic-based element 343. Metal element 444 provides a solderable surface for electrical isolator structure 340 so that electrical isolator structure 340 can be solder-attached to substrate 110, as explained below.

Metal element 444 can comprise the same materials identified for electrical leads 341 and 342 and, like electrical leads 341 and 342, can have a solderable surface. If metal element 444 has a single solderable surface, the solderable surface faces towards surface 111 of substrate 110. In one embodiment, metal element 444 and electrical leads 341 and 342 comprise the same or substantially similar materials and are manufactured from the same lead frame or from two separate lead frames. Metal element 444 can also be an individualized component placed between mold plates prior to the molding process for organic-based element 343.

Organic-based element 343 is molded to metal element 444, which can include mold locks 445 to improve the adhesion of organic-based element 343 to metal element 444. Mold locks 445 can vary in shape, size, and technique. For example, mold locks 445 can include one or more through-holes in metal element 444 in place of or in addition to the mold locks illustrated in FIG. 4. Mold locks 445 can also include wrap-around techniques. Although not illustrated in FIG. 4, electrical leads 341 and 342 can also include the same or different mold locking techniques to improve the adhesion of organic-based element 343 to electrical leads 341 and 342.

Organic-based element 343 can be formed by using an injection, transfer, or other molding process to mold organic-based element 343 simultaneously to metal element 444 and electrical leads 341 and 342. The portion of organic-based element 343 located over leads 341 and 342 is optional and can be eliminated in some embodiments of semiconductor structure 100.

Semiconductor structure 100 further includes a solder element 350 located over surface 111 of substrate 110. Solder element 350 couples together electrical isolator structure 340 and substrate 110. More specifically solder element 350 solders together the solderable surface of metal element 444 and a portion of layer 113 of surface 111 of substrate 110. Accordingly, solder element 350 is located between metal element 444 and substrate 110. As an example solder element 350 can comprise the same solder materials identified for adhesive 230 (FIG. 2), as well as other solder materials known in the art, and can be formed in a similar manner. Solder element 350 can have a melting temperature and reflow temperature lower than those of adhesive 230.

As illustrated in FIGS. 3 and 4, solder element 350 can have a shape similar to the window frame shape of organic-based element 343. Prior to being reflowed, solder element 350 can be comprised of a single piece, or it can be comprised of two or more discrete pieces. If solder element 350 originates as two or more discrete pieces, the reflow step preferably combines the pieces so that solder element 350 becomes a single, unitary element. Solder element 350 can be a perform, or in a different embodiment, solder element 350 can be deposited onto metal element 444 before molding or attaching electrical isolator structure 340 to substrate 110. In this different embodiment, semiconductor structure 100 would not have a perform, which may enhance the manufacturability of semiconductor structure 100.

In a non-illustrated embodiment, solder element 350 can be deposited onto metal element 444 before attaching electrical isolator structure 340 to substrate 110. In this embodiment, as an example, a layer similar to layer 113 can be formed over or can be used in place of metal element 444 and can comprise layers of gold (Au) and tin (Sn).

Figure 5:
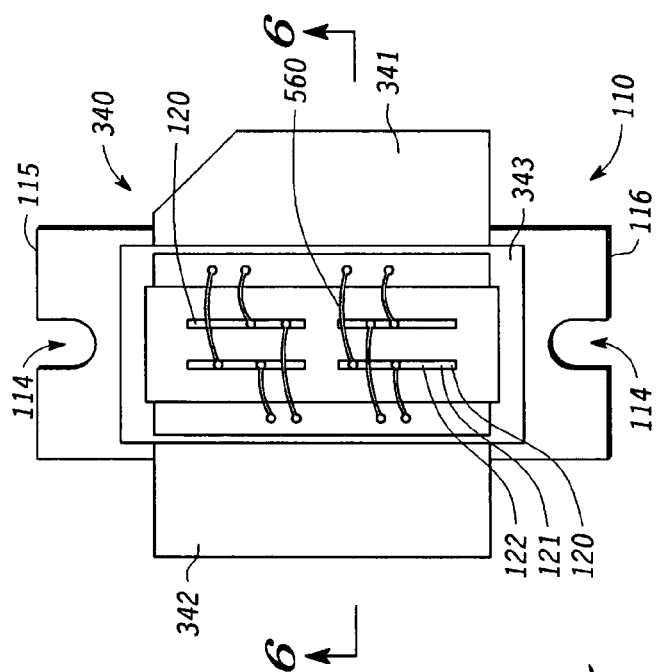
FIG. 5 illustrates a top view of the semiconductor structure in FIG. 3 during a later step of the assembly process in accordance with an embodiment of the invention.
Figure 6:
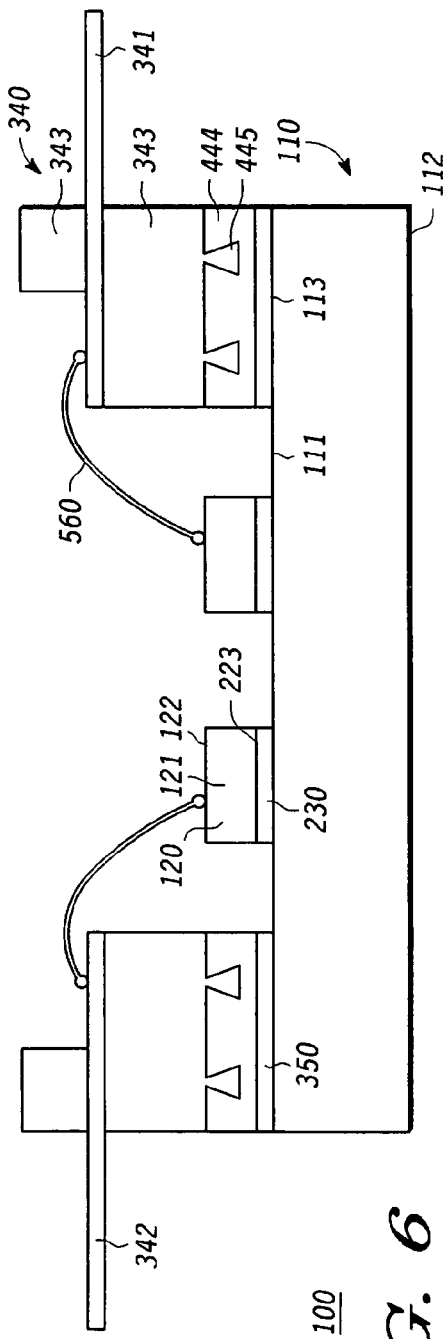
FIG. 6 illustrates a cross-sectional view of the semiconductor structure in FIG. 5, as viewed along a section line 6-6 in FIG. 5, in accordance with an embodiment of the invention.

FIG. 5 illustrates a top view of semiconductor structure 100 during an even later step of the assembly process, and FIG. 6 illustrates a cross-sectional view of semiconductor structure 100 as viewed along a section line 6-6 in FIG. 5. As illustrated in FIGS. 5 and 6, electrical isolator structure 340 is soldered to substrate 110. Semiconductor structure 100 additionally includes wire bonds 560 coupling together semiconductor devices 121 in semiconductor chips 120 and electrical leads 341 and 342. As an example, wire bonds 560 comprise electrically conductive materials, as known in the art, such as, for example, gold, aluminum silicon, aluminum manganese, copper, or the like. In other embodiments, wire bonds 560 are replaced with other electrical interconnect structures such as, for example, solder balls, flip-chip interconnects, tape automated bonding (TAB), and the like.

FIG. 7 illustrates a top view of semiconductor structure 100 during a subsequent step of the assembly process, and FIG. 8 illustrates a cross-sectional view of semiconductor structure 100 as viewed along a section line 8-8 in FIG. 7. Semiconductor structure 100 includes a lid 770 located over substrate 110, semiconductor chips 120, and electrical isolator structure 340. Lid 770 protects semiconductor chips 120 and wire bonds 560 from physical and environmental damage. Lid 770 can be coupled to organic-based element 343 and/or electrical leads 341 and 342. As an example, lid 770 can be comprised of a liquid crystal polymer (LCP), ceramic, or other non-electrically conductive material. Lid 770 can have many different configurations, including a recess to accommodate higher wire bonds.

Substrate 110, organic-based element 343 of electrically isolated structure 340, electrical leads 341 and 342 of electrically isolated structure 340, metal element 444 of electrically isolated structure 340, solder element 350, and lid 770 form at least a gross leakage sealed package having an air gap 880 in which semiconductor chips 120 and wire bonds 560 are located. In a different embodiment, semiconductor structure 100 is a hermetically sealed package.

In one embodiment, semiconductor devices 121 in semiconductor chips 120 are high power, radio frequency devices so the package is a high power, radio frequency package. In the same or different embodiment, air gap 880 can be comprised of other materials such as, for example, nitrogen or another inert gas.

Figure 9:
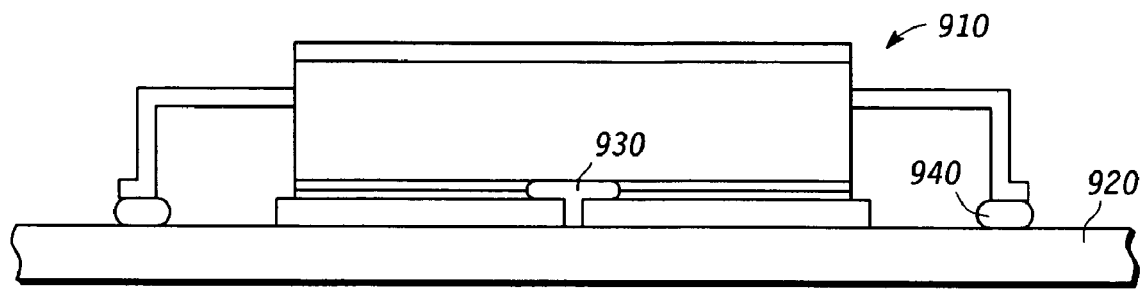
FIG. 9 illustrates a side view of a portion of a semiconductor packaging system in accordance with an embodiment of the invention.

FIG. 9 illustrates a side view of a portion of a semiconductor structure or semiconductor packaging system 900. Semiconductor packaging system 900 includes a package 910 that can be similar to the high power, radio frequency package described in FIGS. 1-8. Semiconductor packaging system 900 also includes a circuit board 920. As an example, circuit board 920 can be a chassis, a heat sink, or a printed circuit board (PC board). Semiconductor packaging system 900 further includes one or more fasteners 930 that can be used to couple package 910 to circuit board 920. For example, fasteners 930 can be screws that fit within recesses 114 of substrate 110 (FIG. 1).

Semiconductor packaging system 900 also includes adhesive 940. In one embodiment, adhesive 940 can be solder that electrically couples leads 341 and 342 (FIGS. 3 and 4) to circuit board 920. As an example, adhesive 940 can be a lead-free solder comprising tin silver copper, tin silver, tin antimony, tin bismuth, tin copper, gold tin, gold germanium, or the like. As another example, adhesive 940 can be a lead-based solder such as lead tin silver. In these embodiments, adhesive 940 has a melting temperature and a reflow temperature lower than those of solder element 350 (FIG. 6) and adhesive 230 (FIG. 2). Although not illustrated in FIG. 9, adhesive 940 or another electrically conductive adhesive can also be located between circuit board 920 and substrate 110 (FIG. 1) of package 910 to electrically couple substrate 110 to circuit board 920. In this embodiment, this adhesive preferably also has a melting temperature and a reflow temperature lower than those of solder element 350 (FIG. 6).

Figure 10:
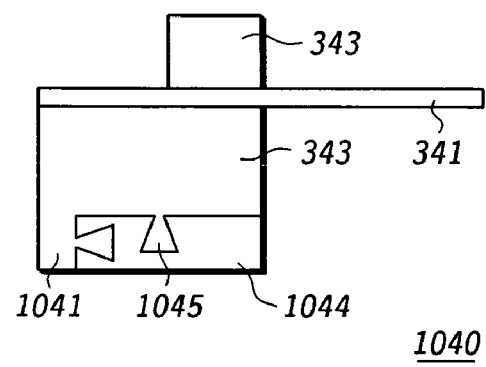
FIGS. 10 and 11 illustrate cross-sectional views of a portion of an electrical isolator structure in accordance with other embodiments of the invention.

FIG. 10 illustrates a cross-sectional view of a portion of an electrical isolator structure 1040, which is a different embodiment of electrical isolator structure 340 (FIGS. 3 and 4). Electrical isolator structure 1040 includes a metal element 1044, instead of metal element 444 (FIG. 4) in electrical isolator structure 340. Metal element 1044 is similar to metal element 444, except that metal element 1044 has a smaller footprint than metal element 444. Accordingly, a surface of metal element 1044 that faces towards substrate 110 (FIG. 4) has a surface area that is less than a surface area of a surface of organic-based element 343 that also faces towards substrate 110. (In FIG. 4, metal element 444 has substantially the same inner and out perimeters as organic-based element 343 such that the surface of metal element 444 that faces towards substrate 110 has a surface area that is substantially the same as a surface area of a surface of organic-based element 343 that also faces towards substrate 110.) In this embodiment, a portion 1041 of organic-based element 343 is not covered by metal element 1044 and serves as a solder dam to inhibit solder run-out or ingress of solder element 350 (FIGS. 3 and 4) towards semiconductor chips 120 (FIG. 4).

Another difference between metal element 1044 in FIG. 10 and metal element 444 in FIG. 4 is that metal element 1044 has mold locks 1045 on two different surfaces of metal element 1044. In particular, as illustrated in FIG. 10, metal element 1044 has mold locks 1045 on two adjacent surfaces of metal element 1044. The additional mold lock on the side surface of metal element 1044 can improve the adhesion of organic-based element 343 to metal element 1044.

Figure 11:
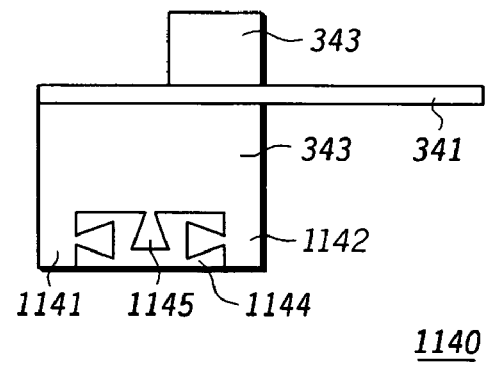

FIG. 11 illustrates a cross-sectional view of a portion of an electrical isolator structure 1140, which is another embodiment of electrical isolator structure 340 (FIGS. 3 and 4). Electrical isolator structure 1140 includes a metal element 1144, instead of metal element 444 (FIG. 4) in electrical isolator structure 340. Metal element 1144 is similar to metal element 444, except that metal element 1044 has a smaller footprint than metal element 444. (Metal element 1144 also has a smaller footprint than metal element 1044 in FIG. 10.) In this embodiment, a portion 1141 of organic-based element 343 is not covered by metal element 1144 and serves as a solder dam to inhibit solder run-out or ingress of solder element 350 (FIGS. 3 and 4) towards semiconductor chips 120 (FIG. 4). Furthermore, a portion 1142 of organic-based element 343 is also not covered by metal element 1144 and serves as another solder dam to inhibit solder run-out or "outgress" of solder element 350 (FIGS. 3 and 4) external to the package. Also in this embodiment, metal element 1144 is not exposed at an exterior surface of the package, except at lead frame trim locations.

Another difference between metal element 1144 in FIG. 11 and metal element 444 in FIG. 4 is that metal element 1144 has mold locks 1145 on three different surfaces of metal element 1144. In particular, as illustrated in FIG. 11, metal element 1144 has mold locks 1145 on three adjacent surfaces of metal element 1144. The additional mold locks on the side surfaces of metal element 1144 can improve the adhesion of organic-based element 343 to metal element 1144.

Figure 12:
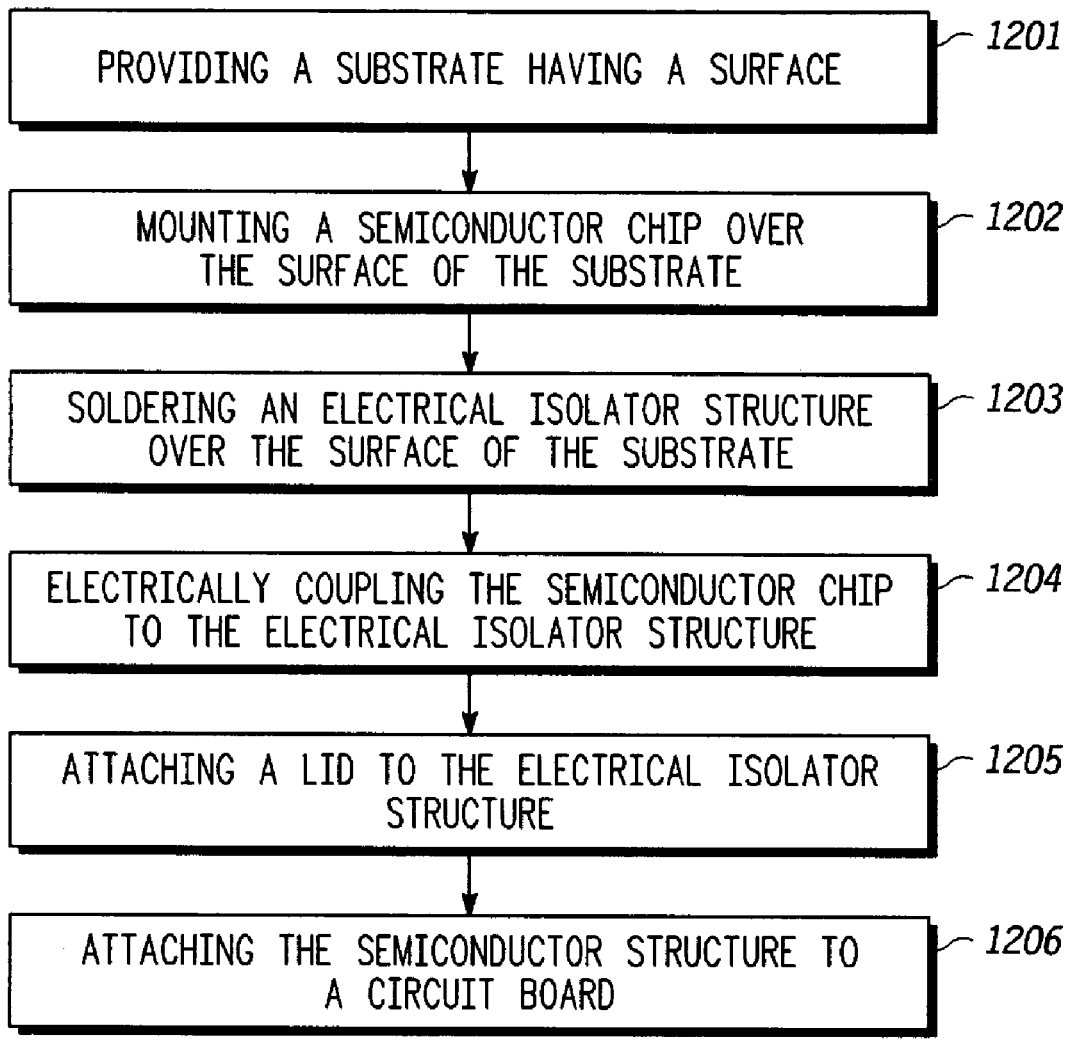
FIG. 12 illustrates a flow chart of a method of assembling a semiconductor structure or semiconductor packaging system in accordance with an embodiment of the invention.

FIG. 12 illustrates a flow chart 1200 of a method of assembling a semiconductor structure. As an example, the semiconductor structure of flow chart 1200 can be similar to semiconductor structure 100 of FIGS. 1-8, semiconductor packaging system 900 of FIG. 9, and all of their various embodiments.

Flow chart 1200 includes a step 1201 for providing a substrate having a surface. As an example, the substrate of step 1201 can be similar to substrate 110 in FIGS. 1 and 2, and the surface of the substrate in step 1201 can be similar to surface 111 of substrate 110 in FIGS. 1 and 2.

Flow chart 1200 also includes a step 1202 for mounting a semiconductor chip to or over the surface of the substrate. As an example, the semiconductor chip of step 1202 can be similar to semiconductor chips 120 in FIGS. 1 and 2 and can include one or more semiconductor devices. Similar to the adhesive used to mount semiconductor chips 120 to substrate 110, a solder element or other adhesive can be used for the mounting step. Step 1202 can also be referred to as a die attach step. In one embodiment, step 1202 occurs above a solder or epoxy melting temperature of approximately three hundred seventy degrees Celsius. In the same or different embodiment, step 1202 occurs at a solder or epoxy reflow temperature of approximately four hundred ten degrees Celsius.

In an embodiment where one or more matching elements are used in the semiconductor structure, step 1202 can include mounting the matching element(s) to or over the surface of the substrate. In this embodiment, the matching element(s) can be mounted before, simultaneously with, or after the semiconductor chip(s).

Flow chart 1200 continues with a step 1203 for soldering an electrical isolator structure over the surface of the substrate. As an example, the electrical isolator structure of step 1203 can be similar to electrical isolator structure 340 in FIGS. 3 and 4 and/or its various embodiments, and a solder element can be used to mount the electrical isolator structure to the surface of the substrate. In one embodiment, step 1203 occurs above a solder melting temperature of approximately two hundred eighty degrees Celsius. In the same or different embodiment, step 1203 occurs at a solder reflow temperature of approximately three hundred twenty degrees Celsius.

In the preferred embodiment, step 1203 occurs at a lower temperature than step 1202, and step 1203 occurs after step 1202. In this embodiment, the higher temperature of step 1202 does not melt the solder used for the electrical isolator structure in step 1203 or alter the position of the electrical isolator structure relative to the substrate and the semiconductor chip, which may detrimentally affect the reliability and electrical performance of the semiconductor structure. Also in the preferred embodiment, steps 1202 and 1203 occur serially, instead of in parallel, for more precise relative positioning of the electrical isolator structure and the semiconductor chips over the surface of the substrate, which produces improved electrical performance of the semiconductor structure.

In the preferred embodiment, after step 1203, flow chart 1200 continues with a step 1204 for electrically coupling the semiconductor chip to the electrical isolator structure. As an example, wire bonds 560 and other the interconnect structures described with reference to FIGS. 5 and 6 can be used during step 1204 to electrically couple the semiconductor device of the semiconductor chip to the electrical leads of the electrical isolator structure.

Flow chart 1200 also includes a step 1205 for attaching a lid to the electrical isolator structure. As an example, the lid of step 1205 can be similar to lid 770 in FIGS. 7 and 8. In one embodiment, the lid hermetically or at least gross leak seals the semiconductor chip within the semiconductor structure. In the same or different embodiment, step 1205 can use epoxy or other adhesives to attach the lid to the electrical isolator structure, or step 1205 can use sonic, ultrasonic, thermal, or other welding techniques to accomplish the same. In an alternative embodiment, step 1205 can attach the lid to the surface of the substrate. In another alternative embodiment, step 1205 can be performed simultaneously with step 1203, or step 1205 can be performed prior to step 1203.

Flow chart 1200 additionally includes a step 1206 for attaching the semiconductor structure to a circuit board. As an example, the circuit board of step 1206 can be similar to circuit board 920 of FIG. 9. As illustrated in FIG. 12, step 1206 can occur after steps 1201-1205.

In one embodiment, a fastener, such as, for example, fastener 930 in FIG. 9, can be used to attach the semiconductor structure to the circuit board. In the same or different embodiment, an adhesive such as, for example, adhesive 940 in FIG. 9 can be used to attach one or more electrical leads of the semiconductor structure to the circuit board. When an adhesive is used during step 1206, step 1206 can occur above a solder melting temperature of approximately two hundred fifteen to two hundred twenty degrees Celsius. In the same or different embodiment, step 1206 can occur at a solder reflow temperature of approximately two hundred forty to two hundred sixty degrees Celsius. In the preferred embodiment, step 1206 occurs at a lower temperature than steps 1202-1205, and step 1206 occurs after steps 1201-1205 so that the higher temperatures of steps 1202-1205 do not melt the solder or other adhesives used to attach the semiconductor structure to the circuit board.

In view of all the above, a new high power, radio frequency or other high frequency semiconductor structure and semiconductor packaging system is described that is less expensive and has improved reliability. The more mechanically and thermally robust structure and packaging system provides the lower cost and improved reliability advantages over other package designs.

Although the invention has been described with reference to specific embodiments, it will be understood by those skilled in the art that various changes may be made without departing from the spirit or scope of the invention. Various examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims. For example, it will be readily apparent to one of ordinary skill in the art that the configuration, geometry, shape, and size of electrical isolator structure 340 in FIGS. 3 and 4 and mold locks 445, 1045, and 1145 in FIGS. 4, 10, and 11, respectively, may vary, and that the foregoing discussion of certain of these embodiments does not necessarily represent a complete description of all possible embodiments. Similarly, the material compositions of the various elements of semiconductor structure 100 and semiconductor packaging system 900 may vary from the details described above.

All elements claimed in any particular claim are essential to the invention claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A semiconductor structure comprising:
   a substrate having a first surface;
   a semiconductor chip located over the first surface of the substrate;
   an electrical isolator structure located over the first surface of the substrate, wherein the electrical isolator structure comprises an electrical lead and an organic-based element molded to the electrical lead; and
   a solder element coupling together the electrical isolator structure and the first surface of the substrate,
   wherein:
   the electrical isolator structure further comprises a metal element;
   the organic-based element is molded to the metal element; and
   the organic-based element is located between the metal element and the electrical lead.

2. The semiconductor structure of claim 1 wherein:
   the substrate is comprised of an electrically conductive material and is electrically coupled to the semiconductor chip.

3. The semiconductor structure of claim 1 wherein:
   the metal element has a solderable surface facing towards the solder element; and
   the solder element is soldered to the solderable surface of the metal element.

4. The semiconductor structure of claim 1 wherein:
   the metal element is located between the solder element and the electrical lead and between the solder element and the organic-based element.

5. The semiconductor structure of claim 1 wherein:
   the organic-based element electrically insulates the electrical lead from the metal element.

6. The semiconductor structure of claim 1 wherein:
   the metal element has a surface facing towards the substrate and having a first surface area;
   the organic-based element has a surface facing towards the substrate and having a second surface area; and
   the first surface area is less than the second surface area.

7. The semiconductor structure of claim 6 wherein:
   a portion of the second surface area is a solder dam for the solder element.

8. The semiconductor structure of claim 1 further comprising:
   an adhesive located between and coupling together the semiconductor chip and the first surface of the substrate, wherein;
   the solder element has a first melting temperature; and
   the adhesive has a second melting temperature less than the first melting temperature.

9. A semiconductor packaging system comprising:
   a flange comprised of an electrically conductive material and having a first surface;
   at least one semiconductor chip having at least one semiconductor device located over and electrically coupled to the first surface of the flange, wherein the at least one semiconductor device is an active device;
   at least one matching element located over the first surface of the flange;
   a first solder element coupling the at least one semiconductor device to the first surface of the flange, wherein the first solder element comprises a lead-free solder;
   a frame structure located over the first surface of the flange, wherein the frame structure comprises at least two electrical leads, a base metal element located under the at least two electrical leads, and an organic-based, electrically insulative element located between and molded to the at least two electrical leads and the base metal element;
   a second solder element coupling the base metal element to the first surface of the flange; and
   electrical interconnect structures electrically coupling the at least one semiconductor device and the at least one matching element to the at least two electrical leads; and
   a lid located over the flange and the frame structure to at least gross leak seal the at least one semiconductor chip, the at least one matching element, and the electrical interconnect structures therein.

10. The semiconductor packaging system of claim 9 wherein:
    the flange is a third electrical lead for the at least one semiconductor device; and
    the flange further comprises a metal layer overlying the electrically conductive material, wherein the metal layer comprises a solderable surface comprised of nickel and gold.

11. The semiconductor packaging system of claim 10 wherein:
    the base metal element comprises a solderable surface; and
    the second solder element is soldered to the solderable surface of the base metal element and the solderable surface of the flange.

12. The semiconductor packaging system of claim 9 wherein:
    a surface of the organic-based, electrically insulative element facing towards the flange has a first surface area; and
    a surface of the base metal element facing towards the flange has a second surface area less than the first surface area.

13. The semiconductor packaging system of claim 12 wherein:
    the surface of the base metal element covers a first portion of the surface of the organic-based, electrically insulative element;

the surface of the base metal element is absent over a second portion of the surface of the organic-based, electrically insulative element; and the second portion of the surface of the organic-based, electrically insulative element is a solder dam for the second solder element.

14. The semiconductor packaging system of claim 9 wherein:
the base metal element has at least one mold locking feature.

15. The semiconductor packaging system of claim 9 wherein:
the first solder element has a first melting temperature; and
the second solder element has a second melting temperature less than the first melting temperature.

16. The semiconductor packaging system of claim 15 further comprising:
a circuit board; and
a third solder element electrically coupling the at least two electrical leads to the circuit board,
wherein:
the third solder element has a melting temperature less than the second melting temperature.

17. The semiconductor packaging system of claim 9 wherein:
the flange, the frame structure, the second solder element, and the lid form at least a portion of a high power, radio frequency package having an air gap in which the at least one semiconductor chip, the at least one matching element, and the electrical interconnect structures are located.

18. The semiconductor packaging system of claim 9 wherein:
the flange comprises:
an electrically conductive material comprised of copper; and
a solderable metal layer comprised of nickel and gold;
the first solder element comprises gold and silicon;
the at least two electrical leads comprise:
an electrically conductive material comprised of a material selected from the group consisting of copper, nickel, and iron;
the base metal element comprises:
an electrically conductive material comprised of a material selected from the group consisting of copper, nickel, and iron; and
a solderable metal layer comprised of gold and tin;
the organic-based, electrically insulative element comprises a polymer; and
the second solder element comprises gold and tin.

19. The semiconductor packaging system of claim 9 wherein:
the base metal element and the at least two electrical leads are comprised of substantially similar materials.

20. A semiconductor structure comprising:
a substrate having a first surface;
a semiconductor chip located over the first surface of the substrate;
an electrical isolator structure located over the first surface of the substrate, wherein the electrical isolator structure comprises an electrical lead and an organic-based element; and
a solder element coupling together the electrical isolator structure and the first surface of the substrate,
wherein:
the organic-based element comprises a plastic; and
the electrical isolator structure further comprises a metal element.

21. The semiconductor structure of claim 20 wherein:
the substrate comprises an electrically conductive material and is electrically coupled to the semiconductor chip.

22. A semiconductor structure comprising:
a substrate having a first surface;
a semiconductor chip located over the first surface of the substrate;
an electrical isolator structure located over the first surface of the substrate, wherein the electrical isolator structure comprises an electrical lead and an organic-based element; and
a solder element coupling together the electrical isolator structure and the first surface of the substrate;
an adhesive located between and coupling together the semiconductor chip and the first surface of the substrate,
wherein:
the solder element has a first melting temperature; and
the adhesive has a second melting temperature less than the first melting temperature; and
the organic-based element comprises a plastic.

23. The semiconductor structure of claim 20 wherein:
the organic-based element is located between the metal element and the electrical lead.

24. The semiconductor structure of claim 20 wherein:
the metal element comprises mold locks; and
the organic based element is molded to the mold locks of the metal element and the electrical lead.

25. The semiconductor structure of claim 20 wherein:
the organic-based element comprises one of a plastic polymer, a thermoplastic, and a thermoset plastic.

26. The semiconductor structure of claim 20 wherein:
the organic-based element is located between the electrical lead and the substrate.

27. The semiconductor structure of claim 22 wherein:
the substrate is comprised of an electrically conductive material and is electrically coupled to the semiconductor chip.

* * * * *